United States Patent
Kashima et al.

(10) Patent No.: US 11,871,577 B2
(45) Date of Patent: Jan. 9, 2024

(54) SEMICONDUCTOR STORAGE DEVICE AND MANUFACTURING METHOD THEREOF

(71) Applicant: Kioxia Corporation, Tokyo (JP)

(72) Inventors: Takayuki Kashima, Yokkaichi Mie (JP); Hiroyasu Sato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 251 days.

(21) Appl. No.: 17/010,195

(22) Filed: Sep. 2, 2020

(65) Prior Publication Data
US 2021/0233925 A1 Jul. 29, 2021

(30) Foreign Application Priority Data
Jan. 29, 2020 (JP) ................. 2020-012717

(51) Int. Cl.
*H10B 43/50* (2023.01)
*H01L 21/3213* (2006.01)
(Continued)

(52) U.S. Cl.
CPC ........ *H10B 43/50* (2023.02); *H01L 21/31116* (2013.01); *H01L 21/31144* (2013.01); *H01L 21/32136* (2013.01); *H01L 21/32139* (2013.01); *H10B 43/10* (2023.02); *H10B 43/27* (2023.02); *H10B 43/35* (2023.02); *H10B 43/40* (2023.02)

(58) Field of Classification Search
CPC .......... H01L 27/11582; H01L 27/1157; H01L 21/31144; H01L 21/31116; H01L 27/11575
See application file for complete search history.

(56) References Cited

U.S. PATENT DOCUMENTS 9,490,262 B1 11/2016 Pang et al.
9,853,043 B2 12/2017 Lu et al.
(Continued)

FOREIGN PATENT DOCUMENTS

CN 102651369 A 8/2012
CN 107810552 A 3/2018
(Continued)

OTHER PUBLICATIONS

Lassner et al., "Tungsten: Properties, Chemistry, Technology of the Element, Alloys, and Chemical Compounds" Kluwer Academic (1999).
(Continued)

*Primary Examiner* — Mohammad M Choudhry
(74) *Attorney, Agent, or Firm* — Foley & Lardner LLP

(57) ABSTRACT

According to one embodiment, a semiconductor storage device includes a substrate; a stacked body provided above the substrate, wherein the stacked body includes a plurality of first insulating layers and a plurality of conductive layers that are alternately stacked on top of one another along a vertical direction; a plurality of columnar portions that penetrate the stacked body; a first slit, provided in the vertical direction, that divides one or more of the plurality of conductive layers at least at an upper portion of the stacked body; and a second insulating layer that overlays an opening of the first slit, which forms a cavity.

11 Claims, 20 Drawing Sheets

(51) Int. Cl.
  *H01L 21/311* (2006.01)
  *H10B 43/10* (2023.01)
  *H10B 43/27* (2023.01)
  *H10B 43/35* (2023.01)
  *H10B 43/40* (2023.01)

(56) References Cited

U.S. PATENT DOCUMENTS

| | | |
|---|---|---|
| 9,875,929 B1 | 1/2018 | Shukla et al. |
| 10,256,247 B1 | 4/2019 | Kanakamedala et al. |
| 2012/0217568 A1 | 8/2012 | Oda |
| 2016/0071741 A1* | 3/2016 | Imamura .......... H01L 27/11582 |
| | | 438/702 |
| 2017/0062454 A1 | 3/2017 | Lu et al. |
| 2018/0277555 A1* | 9/2018 | Fukushima ....... H01L 21/76834 |
| 2019/0252397 A1 | 8/2019 | Sakamoto et al. |
| 2019/0296031 A1 | 9/2019 | Murata et al. |

FOREIGN PATENT DOCUMENTS

| | | |
|---|---|---|
| CN | 108630699 A | 10/2018 |
| CN | 109791891 A | 5/2019 |
| CN | 110299363 A | 10/2019 |
| TW | 201841347 A | 11/2018 |

OTHER PUBLICATIONS

Kirt R. Williams et al., "Etch Rates for Micromachining Processing—Part II," Journal of Microelectromechanical Systems, Dec. 2003, vol. 12, No. 6, pp. 761-778.

* cited by examiner

SEMICONDUCTOR STORAGE DEVICE AND MANUFACTURING METHOD THEREOF

CROSS-REFERENCE TO RELATED APPLICATION

This application is based upon and claims the benefit of priority from Japanese Patent Application No. 2020-012717, filed Jan. 29, 2020, the entire contents of which are incorporated herein by reference.

FIELD

Embodiments described herein relate generally to a semiconductor storage device and a manufacturing method thereof.

BACKGROUND

In recent years, a semiconductor storage device including a three-dimensional memory cell array is developed. Memory cells of such a semiconductor storage device are three-dimensionally arranged. In the semiconductor storage device, a slit is provided on an upper portion of the memory cell array to divide a select gate.

The slit is formed in a stacked film of an insulating layer and a conductive layer, with a columnar portion extending through the stacked film in a memory hole. However, a material such as a metal material, which is hard to control etching, is used for the conductive layer and the columnar portion. Therefore, when to widen a width at a bottom portion of the slit in order to sufficiently and electrically isolate the adjacent select gates, an upper opening of the slit becomes too wide, and a depth of the slit becomes too deep, which is against miniaturization of the memory cell array. Poor etching controllability causes fluctuation in the depth of the slit in the conductive layer and the columnar portion.

Since the conductive layer and the columnar portion have the poor etching controllability, an inner wall of the slit has a tapered profile, e.g., the bottom portion of the slit is tapered. In order to surely divide the select gate at the bottom portion of the tapered slit, it is desired to deepen the slit and widen the width at the bottom portion of the slit to some extent. As described above, the taper shape of the slit also causes the slit to become deep. When the slit is deep, it is required to prepare a large number of conductive layers to be dummy (dummy word lines) in a stacked body. What is described above is also against the miniaturization of the memory cell array.

DETAILED DESCRIPTION

The exemplary embodiments provide for a semiconductor storage device in which a plurality of select gates at an upper portion of a memory cell array are surely divided, and the size of the memory cell array is reduced, and a manufacturing method thereof.

In general, according to one embodiment, a semiconductor storage device includes: a substrate; a stacked body provided above the substrate, wherein the stacked body includes a plurality of first insulating layers and a plurality of conductive layers that are alternately stacked on top of one another along a vertical direction; a plurality of columnar portions that penetrate the stacked body; a first slit, provided in the vertical direction, that divides one or more of the plurality of conductive layers at least at an upper portion of the stacked body; and a second insulating layer that overlays an opening of the first slit, which forms a cavity.

Hereinafter, embodiments according to the present disclosure will be described with reference to the drawings. The embodiments do not limit the present disclosure. In the following embodiments, a vertical direction of a semiconductor substrate indicates a relative direction when a surface on which a semiconductor element is provided is defined as UP, and may be different from a vertical direction according to acceleration of gravity. The drawings are schematic or conceptual, and a proportion of each portion is not necessarily the same as that of the actual one. In the specification and drawings, the same elements as those described above with reference to the already illustrated drawings will be denoted by the same reference signs, and detailed description thereof will be appropriately omitted.

First Embodiment

Figure 1A:
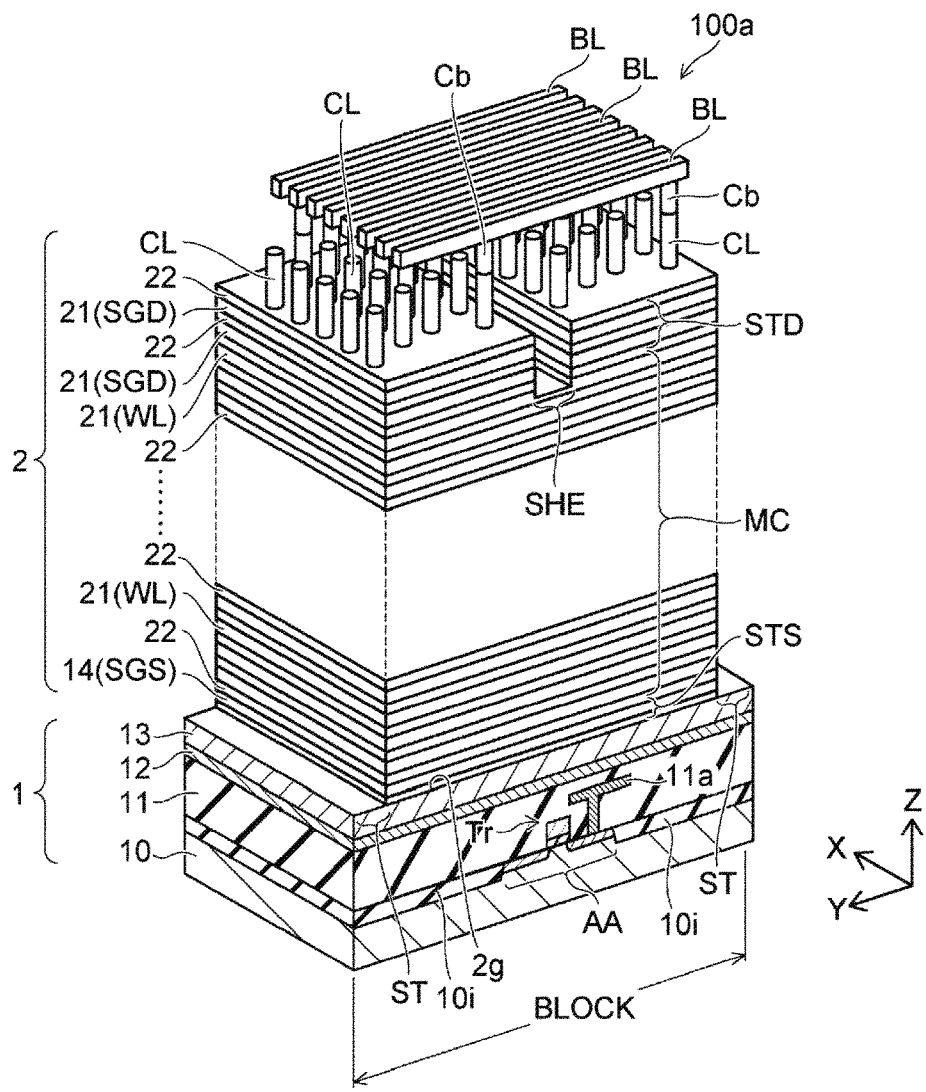
FIG. 1A is a schematic perspective view illustrating a semiconductor storage device according to a first embodiment.
Figure 1B:
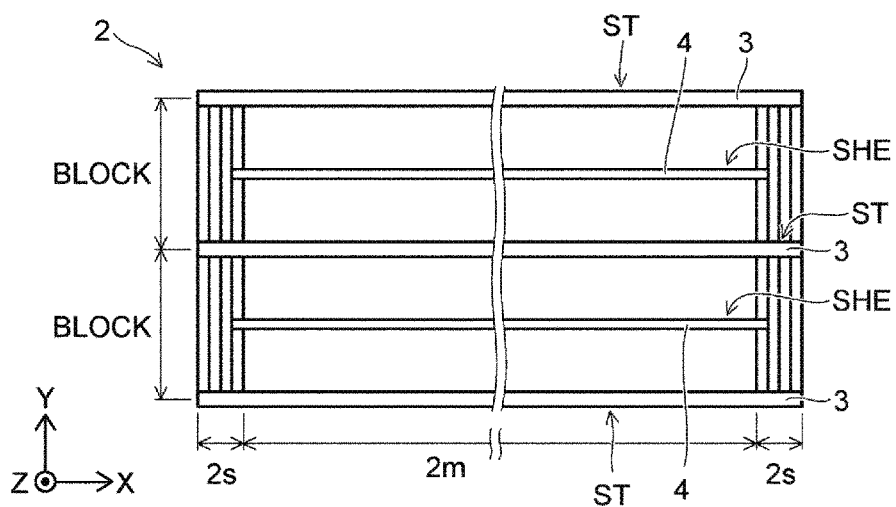
FIG. 1B is a schematic plan view illustrating a stacked body.
Figure 2A:
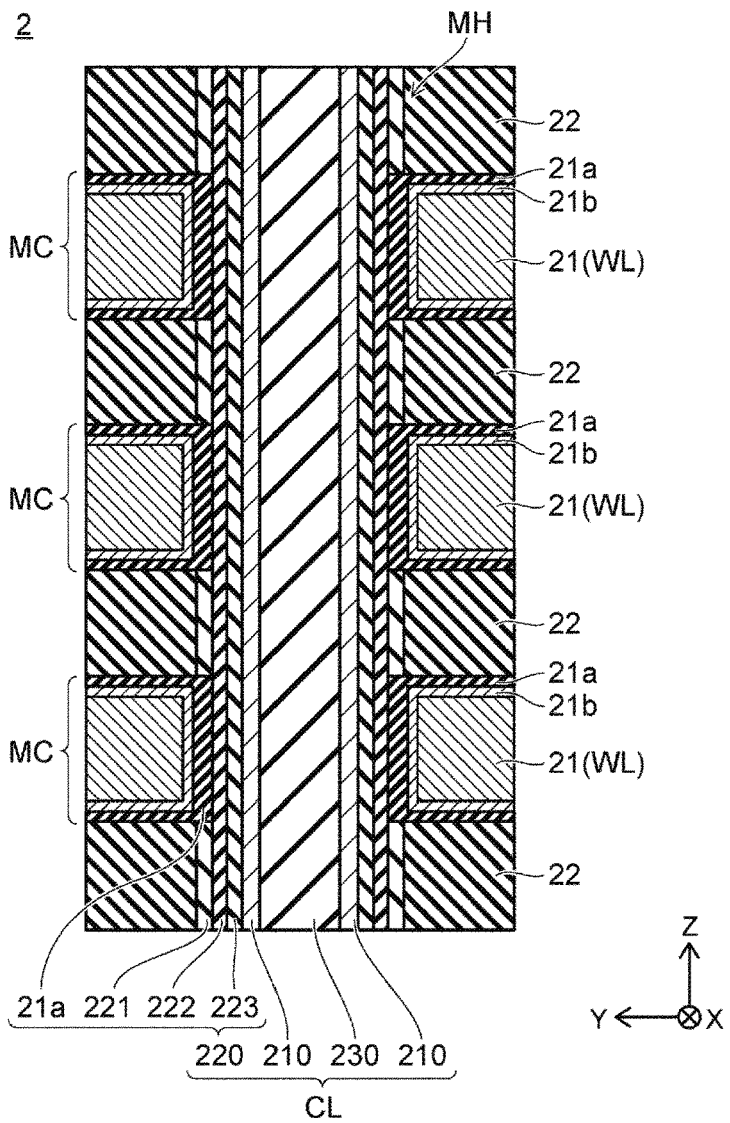
FIG. 2A is a schematic cross-sectional view illustrating a memory cell of a three-dimensional structure.
Figure 2B:
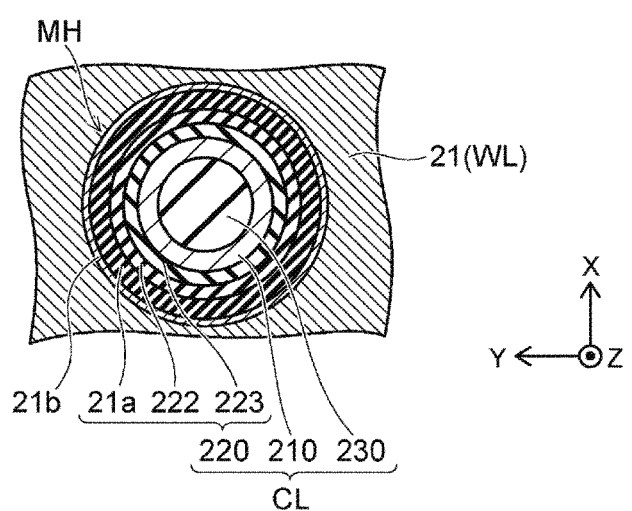
FIG. 2B is a schematic cross-sectional view illustrating the memory cell of the three-dimensional structure.
Figure 3:
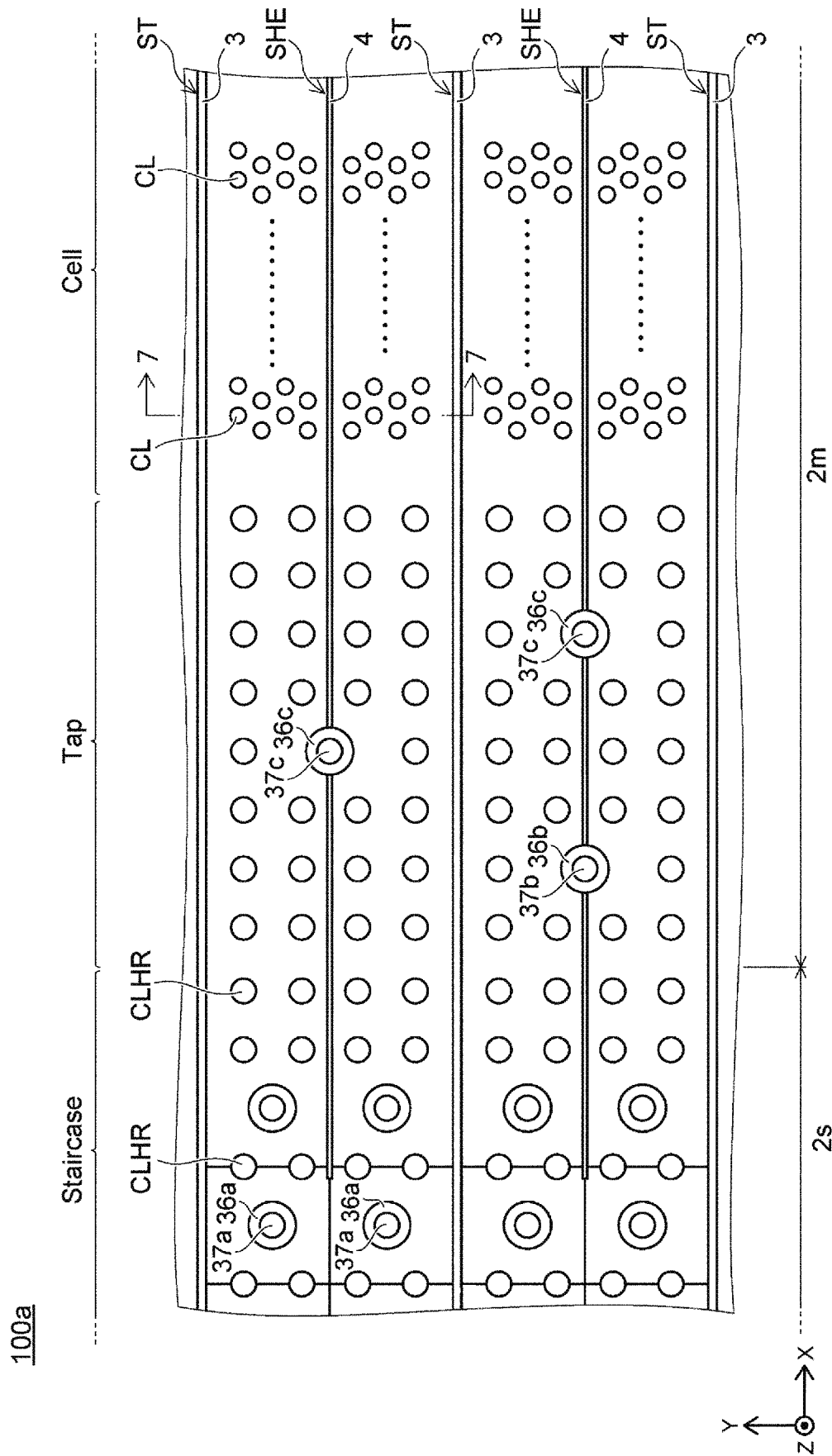
FIG. 3 is a schematic plan view illustrating the semiconductor storage device according to the first embodiment.

FIG. 1A is a schematic perspective view illustrating a semiconductor storage device 100a according to a first embodiment. FIG. 1B is a schematic plan view illustrating a stacked body 2. In the specification, a stacking direction of the stacked body 2 is defined as a Z direction. One direction that intersects the Z direction, and for example, that is orthogonal thereto is defined as a Y direction. One direction that intersects each of the Z and Y directions, and for example, that is orthogonal thereto is defined as an X direction. FIGS. 2A and 2B are schematic cross-sectional views respectively illustrating a memory cell of a three-dimensional structure. FIG. 3 is a schematic plan view illustrating the semiconductor storage device 100a according to the first embodiment.

As illustrated in FIGS. 1A to 3, the semiconductor storage device 100a according to the first embodiment is a nonvolatile memory including the memory cell of the three-dimensional structure.

The semiconductor storage device 100a includes a base body portion 1, the stacked body 2, a deep slit ST (plate-shaped portion 3), a shallow slit SHE, and a plurality of columnar portions CL.

The base body portion 1 includes a substrate 10, an insulating film 11, a conductive film 12, and a semiconductor portion 13. The insulating film 11 is provided on the substrate 10. The conductive film 12 is provided on the insulating film 11. The semiconductor portion 13 is provided on the conductive film 12. The substrate 10 is a semiconductor substrate, for example, a silicon substrate. A conductivity type of silicon (Si) is, for example, a p-type. For example, an element isolation area 10i is provided in a front surface area of the substrate 10. The element isolation area 10i is, for example, an insulating area containing a silicon oxide, and partitions an active area AA in the front surface area of the substrate 10. A source area and a drain area of a transistor Tr are provided in the active area AA. The transistor Tr forms a peripheral circuit (a complementary metal oxide semiconductor (CMOS) circuit) of the nonvolatile memory. The insulating film 11 contains, for example, silicon oxide ($SiO_2$), and insulates the transistor Tr. A wiring 11a is provided in the insulating film 11. The wiring 11a is a wiring electrically connected to the transistor Tr. The conductive film 12 contains a conductive metal such as tungsten (W). The semiconductor portion 13 contains, for example, silicon. A conductivity type of silicon is, for example, an n-type. A part of the semiconductor portion 13 may contain undoped silicon.

The stacked body 2 is provided above the substrate 10 and is located in the Z direction with respect to the semiconductor portion 13. The stacked body 2 is configured such that a plurality of conductive layers 21 and a plurality of insulating layers 22 are alternately stacked along the Z direction. The conductive layer 21 contains a conductive metal such as tungsten. For example, the insulating layer 22 contains a silicon oxide. The insulating layer 22 insulates the conductive layers 21 from each other. The number of layers of each of the conductive layer 21 and the insulating layer 22 is freely selected. The insulating layer 22 may be, for example, an air gap. For example, an insulating film 2g is provided between the stacked body 2 and the semiconductor portion 13. The insulating film 2g contains, for example, a silicon oxide ($SiO_2$). The insulating film 2g may include a high dielectric having a relative dielectric constant higher than that of the silicon oxide. The high dielectric is, for example, a metal oxide.

The conductive layer 21 includes at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in a lower area of the stacked body 2. The drain-side select gate SGD is provided in an upper area of the stacked body 2. The lower area refers to an area of the stacked body 2 on the side closer to the base body portion 1, and the upper area refers to an area of the stacked body 2 on the side farther from the base body portion 1. The word line WL is provided between the source-side select gate SGS and the drain-side select gate SGD.

Among the plurality of insulating layers 22, a thickness in the Z direction of the insulating layer 22 that insulates the source-side select gate SGS and the word line WL may be thicker than, for example, a thickness in the Z direction of the insulating layer 22 that insulates the word line WL and the word line WL. A cover insulating film (not illustrated) may be provided on top of the insulating layer 22 that is farthest from the base body portion 1. The cover insulating film contains, for example, a silicon oxide.

The semiconductor storage device 100a includes a plurality of memory cells MC connected in series between the source-side select transistor STS and the drain-side select transistor STD. A structure in which the source-side select transistor STS, the memory cell MC, and the drain-side select transistor STD are connected in series is referred to as a "memory string" or a "NAND string". For example, the memory string is connected to a bit line BL via a contact Cb. The bit line BL is provided above the stacked body 2 and extends in the Y direction.

A plurality of deep slits ST and a plurality of shallow slits SHE are respectively provided in the stacked body 2. The deep slit ST extends in the X direction and is provided in the stacked body 2 while penetrating the stacked body 2 from an upper end of the stacked body 2 to the base body portion 1. The plate-shaped portion 3 is provided in the deep slit ST (FIG. 1B). The plate-shaped portion 3 includes, for example, at least an insulator. This insulator is, for example, a silicon oxide. The plate-shaped portion 3 may include a conductive material that is electrically connected to the semiconductor portion 13 while being electrically insulated from the stacked body 2 by an insulating material. The shallow slit SHE extends in the X direction and is provided from the upper end of the stacked body 2 to the middle of the stacked body 2. For example, an insulator 4 is provided in the shallow slit SHE (FIG. 1B). The insulator 4 is, for example, a silicon oxide.

As illustrated in FIG. 1B, the stacked body 2 includes a staircase portion 2s and a memory cell array 2m. The staircase portion 2s is provided at an edge portion of the stacked body 2. The memory cell array 2m is interposed between the staircase portions 2s or is surrounded by the staircase portions 2s. The deep slit ST is provided from the staircase portion 2s at one end of the stacked body 2 to the staircase portion 2s at the other end of the stacked body 2 via the memory cell array 2m. The shallow slit SHE is provided at least in the memory cell array 2m.

As illustrated in FIG. 3, the memory cell array 2m includes a cell area (Cell) and a tap area (Tap). The staircase portion 2s includes a staircase area (Staircase) (FIG. 3). The tap area is provided, for example, between the cell area and the staircase area. Although not illustrated in FIG. 3, the tap area may be provided between the cell areas. The staircase area is an area where a plurality of wirings 37a are provided. The tap area is an area where wirings 37b and 37c are provided. Each of the wirings 37a to 37c extends, for example, in the Z direction. Each of the wirings 37a is electrically connected to, for example, the conductive layer 21. The wiring 37b is electrically connected to, for example, the conductive film 12. The wiring 37c is electrically connected to, for example, the wiring 11a.

For purposes of the present disclosure, a portion of the stacked body 2 interposed between the two plate-shaped portions 3 illustrated in FIG. 1B is referred to as a block (BLOCK). The block forms, for example, a minimum unit of data erasing. The insulator 4 is provided in the block. The stacked body 2 between the plate-shaped portion 3 and the insulator 4 is referred to as a finger. The drain-side select gate SGD is divided for each finger. Therefore, at the time of writing and reading data, one finger in the block can go into a selected state by the drain-side select gate SGD.

Each of the plurality of columnar portions CL is provided in a memory hole MH provided in the stacked body 2. Each columnar portion CL passes through the stacked body 2 from the upper end of the stacked body 2 along the Z direction, and is provided in the stacked body 2 and the semiconductor portion 13. Each of the plurality of columnar portions CL includes a semiconductor body 210, a memory film 220, and a core layer 230. The semiconductor body 210 is electrically connected to the semiconductor portion 13. The memory film 220 includes a charge trapping portion between the semiconductor body 210 and the conductive layer 21. The plurality of columnar portions CL selected one by one from each finger are commonly connected to one bit line BL via the contact Cb. Each of the columnar portions CL is provided in, for example, the cell area (Cell) (FIG. 3).

As illustrated in FIGS. 2A and 2B, a shape of the memory hole MH on the XY plane is, for example, a circle or an ellipse. A block insulating film 21a forming a part of the memory film 220 may be provided between the conductive layer 21 and the insulating layer 22. The block insulating film 21a is, for example, a silicon oxide film or a metal oxide film. One example of a metal oxide is an aluminum oxide.

A barrier film 21b may be provided between the conductive layer 21 and the insulating layer 22 and between the conductive layer 21 and the memory film 220. For example, when the conductive layer 21 is tungsten, a stacked structure film of a titanium nitride and titanium is selected as the barrier film 21b. The block insulating film 21a prevents back tunneling of charges from the conductive layer 21 to the side of the memory film 220. The barrier film 21b improves adhesion between the conductive layer 21 and the block insulating film 21a.

A shape of the semiconductor body 210 is, for example, a cylindrical shape having a bottom. The semiconductor body 210 contains, for example, silicon. Silicon is, for example, polysilicon obtained by crystallizing amorphous silicon. The semiconductor body 210 is, for example, undoped silicon. The semiconductor body 210 may also be a p-type silicon. The semiconductor body 210 becomes respective channels of the drain-side select transistor STD, the memory cell MC, and the source-side select transistor STS.

In the memory film 220, portions other than the block insulating film 21a are provided between an inner wall of the memory hole MH and the semiconductor body 210. The memory film 220 has, for example, a cylindrical shape. A plurality of memory cells MC have a storage area between the semiconductor body 210 and the conductive layer 21 serving as the word line WL, and are stacked in the Z direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z direction.

The cover insulating film 221 is provided between the insulating layer 22 and the charge trapping film 222. The cover insulating film 221 contains, for example, a silicon oxide. The cover insulating film 221 protects the charge trapping film 222 from being etched when replacing a sacrifice film (not illustrated) with the conductive layer 21 (a replacement process). The cover insulating film 221 may be removed from between the conductive layer 21 and the memory film 220 in the replacement process. In this case, as illustrated in FIGS. 2A and 2B, for example, the block insulating film 21a is provided between the conductive layer 21 and the charge trapping film 222. When the replacement process is not used for forming the conductive layer 21, the cover insulating film 221 may be omitted.

The charge trapping film 222 is provided between the block insulating film 21a, the cover insulating film 221, and the tunnel insulating film 223. The charge trapping film 222 contains, for example, a silicon nitride, and has a trap site for trapping charges in the film. A portion of the charge trapping film 222 interposed between the conductive layer 21 that becomes the word line WL and the semiconductor body 210 forms a storage area of the memory cell MC as a charge trapping portion. A threshold voltage of the memory cell MC changes depending on the presence or absence of charges in the charge trapping portion or an amount of charges trapped in the charge trapping portion. Accordingly, the memory cell MC stores information.

The tunnel insulating film 223 is provided between the semiconductor body 210 and the charge trapping film 222. The tunnel insulating film 223 contains, for example, a silicon oxide, or a silicon oxide and a silicon nitride. The tunnel insulating film 223 is a potential barrier between the semiconductor body 210 and the charge trapping film 222. For example, when injecting an electron from the semiconductor body 210 into the charge trapping portion (a write operation), and when injecting a hole from the semiconductor body 210 into the charge trapping portion (an erasing operation), the electron and the hole respectively pass through (tunneling) the potential barrier of the tunnel insulating film 223.

The core layer 230 embeds an internal space of the cylindrical semiconductor body 210. For example, the core layer 230 has a columnar shape. The core layer 230 contains, for example, a silicon oxide, and has insulation properties.

Each of the plurality of columnar portions CLHR in FIG. 3 is provided in a hole HR provided in the stacked body 2. The hole HR penetrates the stacked body 2 from the upper end of the stacked body 2 along the Z direction, and is provided in the stacked body 2 and the semiconductor portion 13. Each of the columnar portions CLHR includes at least an insulator 5. The insulator 5 is, for example, a silicon oxide. Each of the columnar portions CLHR may have the same structure as that of the columnar portion CL. Each of the columnar portions CLHR is provided in, for example, the staircase area (Staircase) and the tap area (Tap). The columnar portion CLHR functions as a support member for storing a gap formed in the staircase area and the tap area when the sacrifice film (not illustrated) is replaced with the conductive layer 21 (the replacement process). A plurality of columnar portions CLC4 are formed in the tap area (Tap) of the stacked body 2, an insulating film 32, and an insulating film 31. Each of the columnar portions CLC4 includes the wiring 37c. The wiring 37c is electrically insulated from the stacked body 2 by an insulator 36c. The wiring 37c is electrically connected to any one of the wiring 11a, and the like.

Figure 4:
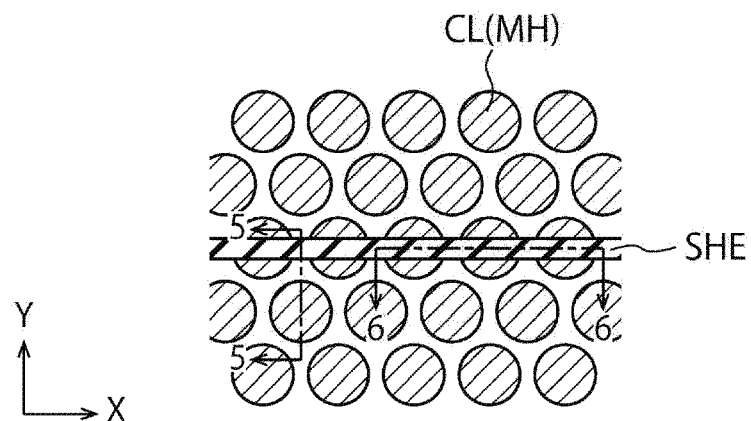
FIG. 4 is a plan view illustrating a configuration of a frame B4 in FIG. 3 in more detail.

The columnar portion CL, that is, the memory hole MH is arranged, in a planar layout, between two slits ST adjacent to each other in the Y direction in a hexagonal closest packing manner. As illustrated in FIG. 4, the shallow slit SHE overlaps a part of the columnar portion CL. The columnar portion CL below the shallow slit SHE does not form the memory cell.

The semiconductor portion 13 of FIG. 1A includes, for example, an n-type semiconductor layer 131, an n-type semiconductor layer 132, and an n-type or undoped semiconductor layer 133. The semiconductor layer 131 contacts the conductive film 12. The semiconductor layer 132 respectively contacts the semiconductor layer 131 and the semiconductor body 210. For example, the semiconductor layer 132 extends to a portion where the memory film 220 is removed, and contacts the semiconductor body 210. The semiconductor layer 132 surrounds the semiconductor body 210 on the X-Y plane. The semiconductor layer 133 contacts the semiconductor layer 132.

The semiconductor storage device 100a further includes a semiconductor portion 14. The semiconductor portion 14 is located between the stacked body 2 and the semiconductor portion 13. The semiconductor portion 14 includes a semiconductor layer 134. The semiconductor layer 134 is provided between an insulating layer 22b of the insulating layer 22 which is closest to the semiconductor portion 13 and the insulating film 2g. A conductivity type of the semiconductor layer 134 is, for example, an n-type. The semiconductor layer 134 functions as, for example, the source-side select gate SGS.

FIG. 4 is a plan view illustrating a configuration of a frame B4 in FIG. 3 in more detail. FIG. 4 illustrates an arrangement relationship between the columnar portion CL (that is, the memory hole MH) and the shallow slit SHE. The columnar portions CL are formed with, for example, a hexagonal closest packing manner. The shallow slit SHE extends in the X direction, and overlaps one row of the columnar portions CL arranged in the X direction.

Figure 5:
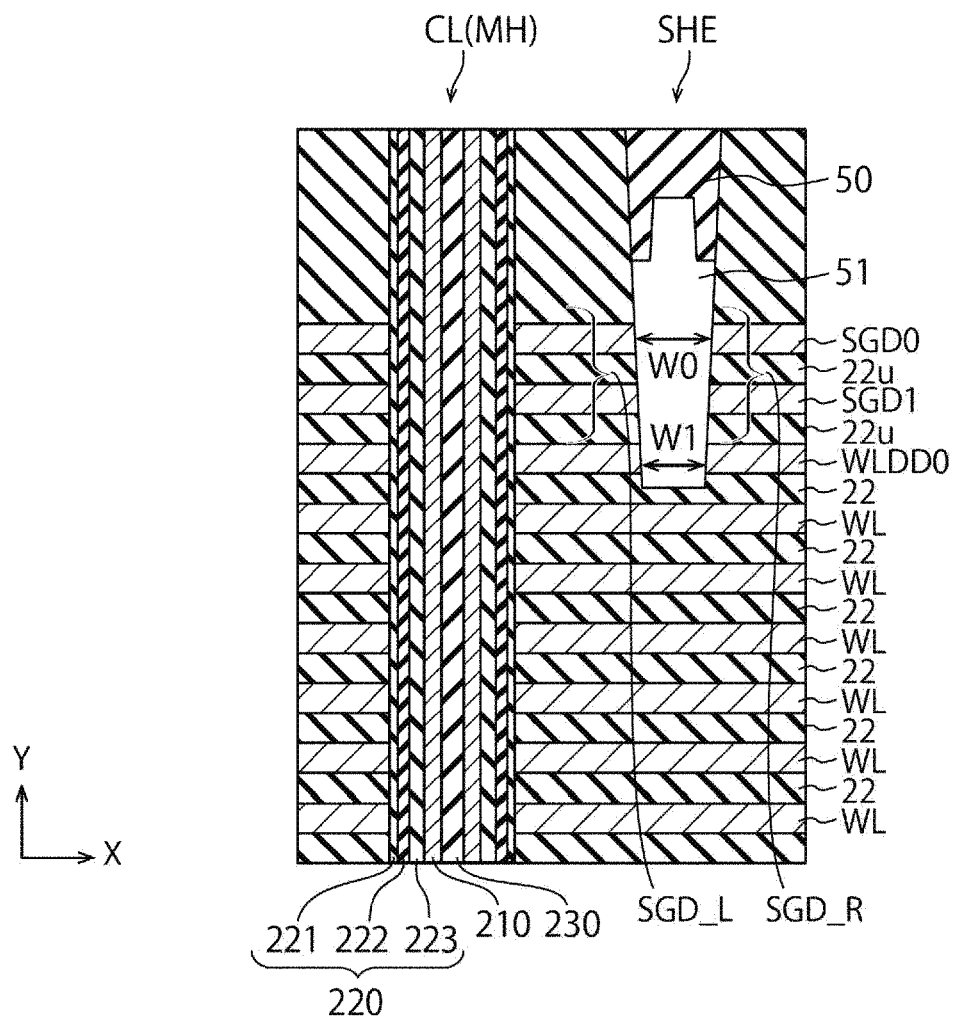
FIG. 5 is a cross-sectional view taken along the line 5-5 of FIG. 4.

FIG. 5 is a cross-sectional view taken along the line 5-5 of FIG. 4. FIG. 5 illustrates one columnar portion CL and one shallow slit SHE which are adjacent to each other. FIG. 5 illustrates only an upper portion of the stacked body 2. Since a configuration of the columnar portion CL is as illustrated with reference to FIGS. 2A and 2B, the description thereof will be omitted.

The slit SHE is provided in the stacking direction (Z direction) of the stacked body 2, and penetrates upper conductive layers (SGD0, SGD1, and WLDD0) and an upper insulating layer (22u) that are located at the upper portion of the stacked body 2. Among the upper conductive layers (SGD0, SGD1, and WLDD0), SGD0 and SGD1 are the drain-side select gates. In the embodiment, a single or a plurality of upper layers among the conductive layers 21 of the stacked body 2 function as the drain-side select gates SGD0 and SGD1. WLDD0 is a dummy word line. The dummy word line WLDD0 has the same configuration as that of the word line of the memory cell array, but does not function as the word line and is provided as an etching area of the slit SHE. Therefore, etching of a groove of the slit SHE is controlled so as to stop at a location of the dummy word line WLDD0. In the embodiment, a single or a plurality of layers directly under the drain-side select gates SGD0 and SGD1 among the conductive layers 21 of the stacked body 2 are provided as the dummy word line WLDD0. The slit SHE may penetrate at least the bottoms of the drain-side select gates SGD0 and SGD1, and in FIG. 5, the slit SHE is provided up to the dummy word line WLDD0. Accordingly, the slit SHE also penetrates the upper insulating layer 22u located between the upper conductive layers (SGD0, SGD1, and WLDD0).

As illustrated in FIGS. 3 and 4, the slit SHE is continuously provided in the X direction, and electrically isolate each of the drain-side select gates SGD0 and SGD1 in the Y direction. The drain-side select gates SGD0 and SGD1 on one side divided by the slit SHE and the drain-side select gates SGD0 and SGD1 on the other side respectively correspond to different fingers. For example, the drain-side select gates SGD0 and SGD1 on the right side of the slit SHE (hereinafter, also collectively referred to as SGD_R) correspond to a plurality of columnar portions on the right side of the slit SHE (not illustrated), and these gates can select this finger. The drain-side select gates SGD0 and SGD1 on the left side of the slit SHE (hereinafter collectively referred to as SGD_L) correspond to a plurality of columnar portions on the left side of the slit SHE, and these gates can select this finger. To avoid capacitive coupling, it is desirable that the slit SHE physically divides the drain-side select gates SGD0 and SGD1 by a wide width to some extent so that the respective drain-side select gates SGD0 and SGD1 which are adjacent to each other in the Y direction are prevented from affecting each other. That is, it is desirable that a distance between the drain-side select gate SGD_R and the drain-side select gate SGD_L is set to be wide to some extent.

However, for example, a metal material that is hard to be etched such as tungsten is used for the drain-side select gates SGD0 and SGD1 and the dummy word line WLDD0. Therefore, an etching process for forming the groove of the slit SHE takes a long time, and the inner wall of the slit SHE is formed in a taper shape. As a result, the width of the slit SHE is wider at the upper portion, and becomes narrower as the slit SHE gets closer to the bottom portion from the upper portion.

Since the inner wall of the slit SHE is formed in the taper shape, a width W0 at the upper portion of the slit SHE is relatively wide, and a width W1 at the bottom portion thereof becomes narrow. Therefore, even though the drain-side select gate SGD0 at the upper portion is sufficiently and widely divided by the slit SHE, an isolation width of the drain-side select gate SGD1 at the lower portion may not be sufficient enough. In order to cope with this problem, when over-etching is performed to widen the width of the slit SHE at a location of the drain-side select gate SGD1, an upper opening of the groove of the slit SHE becomes too wide, and thus a layout area of the slit SHE becomes large. What is described above is against the miniaturization of the memory cell array (MCA). When the groove of the slit SHE is over-etched, a depth of the groove of the slit SHE becomes too deep, and it may be required to increase the number of layers of the dummy word lines. Increasing the number of layers thereof is also against the miniaturization of the memory cell array MCA.

Here, in the embodiment, the insulating film 50 closes or otherwise overlays the upper opening of the groove of the slit SHE, and a cavity (an air gap) 51 is provided in the slit SHE below the insulating film 50. For example, an insulating film such as a silicon oxide film is used for the insulating film 50, and for example, a gas such as air (nitrogen) is used for the cavity 51. A relative dielectric constant of the air gap is lower than a relative dielectric constant of an insulating material such as the silicon oxide film. Therefore, even though the widths W0 and W1 of the slit SHE are narrow, the cavity 51 is provided in the slit SHE, whereby the drain-side select gates SGD0 and SGD1 divided in the Y direction can be electrically and sufficiently isolated. Therefore, the layout area of the slit SHE can be reduced. The widths W1 and W0 of the slit SHE can be narrowed, thereby making it possible to reduce the number of layers of the dummy word lines. As a result, it is possible to achieve the miniaturization of the memory cell array MCA.

Figure 6:
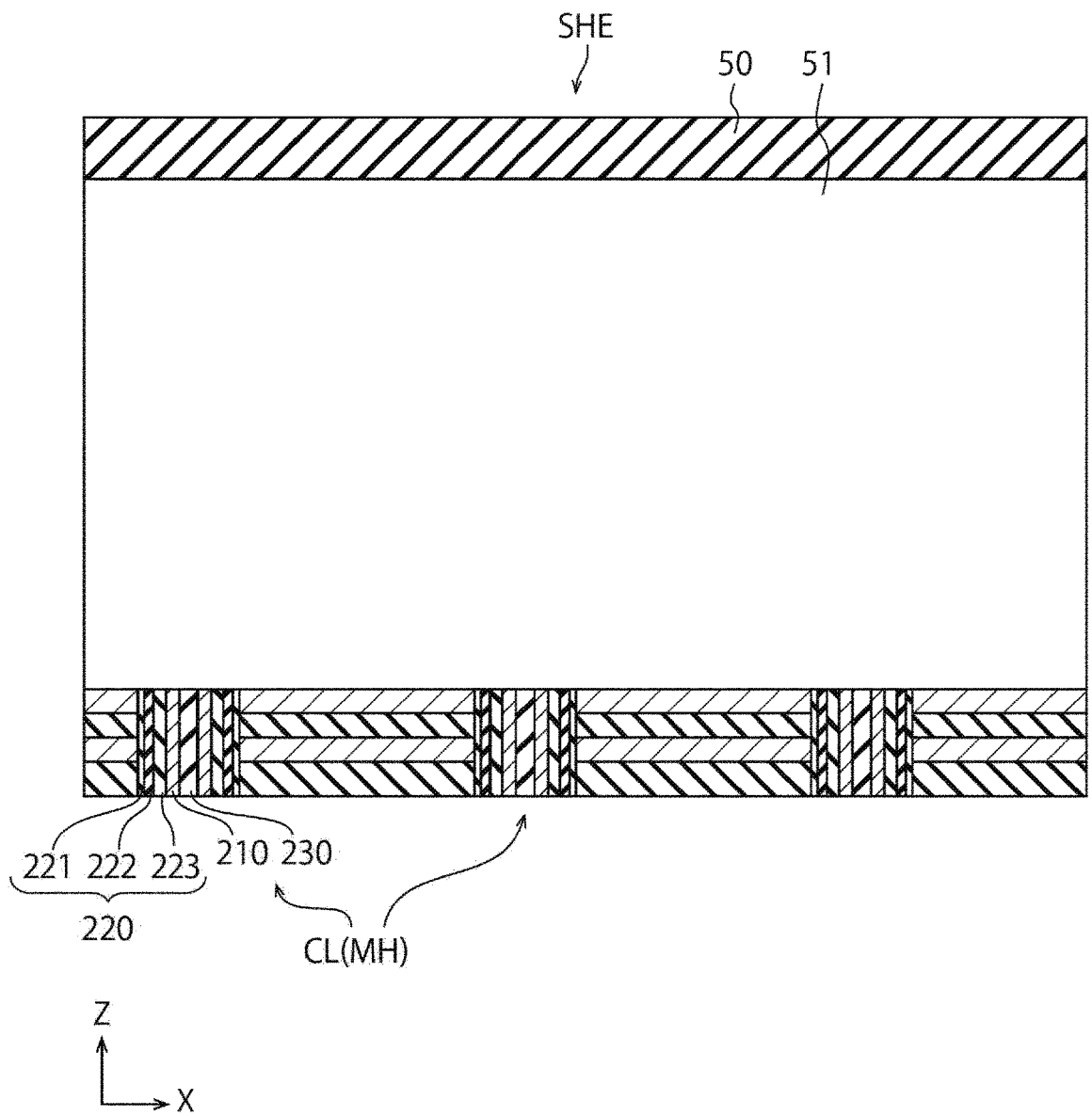
FIG. 6 is a cross-sectional view taken along the line 6-6 of FIG. 4.

FIG. 6 is a cross-sectional view taken along the line 6-6 of FIG. 4. FIG. 6 illustrates that the slit SHE extends in the X direction. FIG. 6 illustrates only the upper portion of the stacked body 2. The slit SHE is formed on a row of the plurality of columnar portions CL arranged in the X direction. The insulating film 50 is embedded in the opening of the slit SHE. The cavity 51 is provided below the insulating film 50 in the slit SHE.

The insulating film 50 in FIG. 5 may be provided from the opening of the slit SHE to the vicinity of the drain-side select gate SGD0 on the upper side. In this case, the cavity 51 is provided only at the bottom portion of the slit SHE. However, when the inner wall of the slit SHE has a taper, as described above, the capacitive coupling in the drain-side select gate at the bottom portion of the slit SHE (for example, in the vicinity of SGD2) becomes a problem. Therefore, the cavity 51 may be provided at least at the bottom portion of the slit SHE.

FIGS. 7 to 19 are cross-sectional views illustrating an example of a manufacturing method of the semiconductor storage device according to the first embodiment. FIGS. 7 to 19 correspond to a cross section taken along line 7-7 of FIG. 3.

Figure 7:
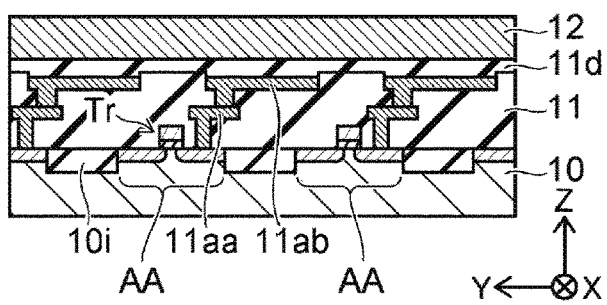
FIG. 7 is a cross-sectional view illustrating an example of a manufacturing method of the semiconductor storage device according to the first embodiment.

As illustrated in FIG. 7, the element isolation area 10i is formed in the substrate 10, and the transistor Tr is formed in the active area AA. Next, the insulating film 11 is formed on the substrate 10. The insulating film 11 is, for example, an interlayer insulating film and includes the wiring 11a. The wiring 11a is, for example, a multilayer wiring, and in FIG. 7, a wiring 11aa and a wiring 11ab provided above the wiring 11aa are illustrated. Next, an insulating film 11d is formed on the wiring 11ab. The insulating film 11d contains, for example, a silicon oxide. Next, the conductive film 12 is formed on the insulating film 11d.

Figure 8:
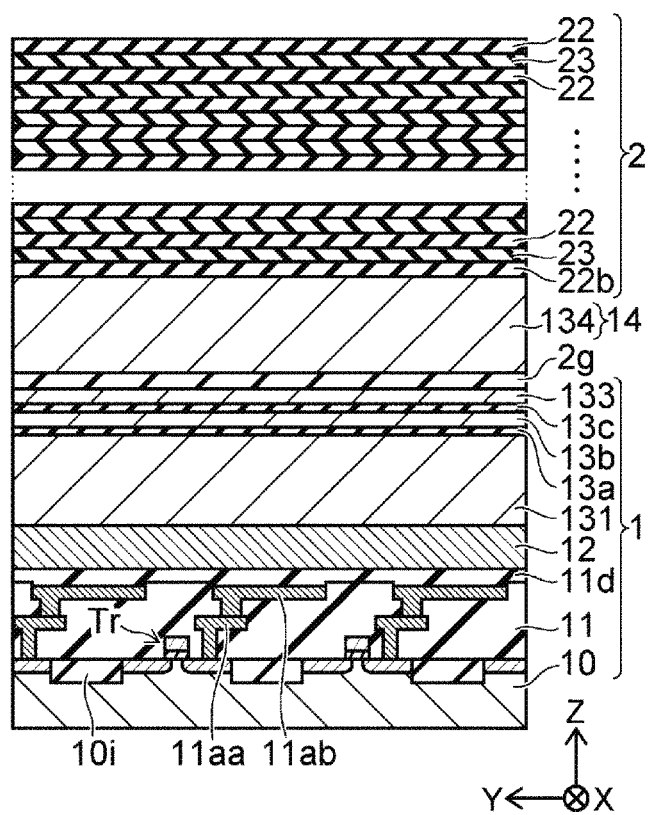
FIG. 8 is a cross-sectional view illustrating an example of the manufacturing method of the semiconductor storage device, following FIG. 7.

Next, as illustrated in FIG. 8, the semiconductor layer 131 is formed on the conductive film 12. The semiconductor layer 131 contains, for example, n-type doped silicon. The conductive film 12 and the semiconductor portion 13 may be integrated semiconductor portions 12 and 13. Next, an intermediate film 13a is formed on the semiconductor layer 131. The intermediate film 13a contains, for example, a silicon oxide. Next, a sacrifice film 13b is formed on the intermediate film 13a. The sacrifice film 13b contains, for example, n-type doped silicon or undoped silicon. Next, the intermediate film 13c is formed on the sacrifice film 13b. The intermediate film 13c contains, for example, a silicon oxide. Next, the semiconductor layer 133 is formed on the intermediate film 13c. The semiconductor layer 133 contains, for example, n-type doped silicon or undoped silicon. Accordingly, for example, a basic structure of the base body portion 1 during the manufacturing can be obtained.

Next, the insulating film 2g is formed on the semiconductor layer 133 and the insulating film 32. The insulating film 2g contains, for example, a silicon oxide or a metal oxide. Next, the semiconductor layer 134 is formed on the insulating film 2g. The semiconductor layer 134 contains, for example, n-type doped silicon. As described above, the semiconductor portion 14 is formed. Next, the insulating layer 22b is formed on the semiconductor layer 134. Continuously, the sacrifice film 23 and the insulating layer 22 are alternately stacked on the insulating layer 22b. Each of the insulating layers 22 and 22b contains, for example, a silicon oxide. The sacrifice film 23 contains, for example, a silicon nitride. Accordingly, it is possible to obtain a basic structure of the stacked body 2 during manufacturing which is located in the Z direction with respect to the semiconductor portion 13.

Next, although not illustrated, the insulating layer 22 and the sacrifice film 23 are processed into a staircase shape, thereby forming the staircase area (Staircase). The columnar portion CLHR is formed.

Figure 9:
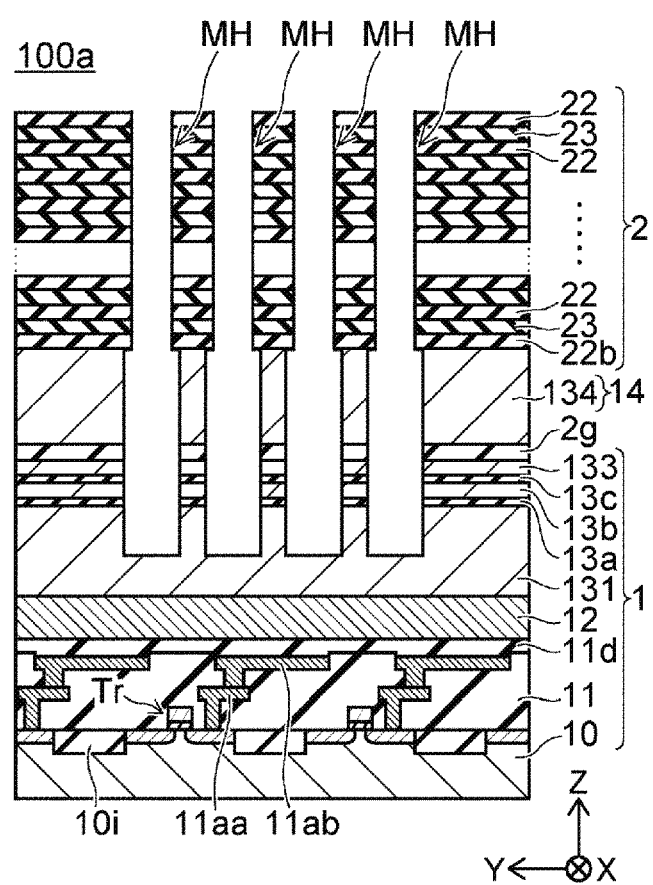
FIG. 9 is a cross-sectional view illustrating an example of the manufacturing method of the semiconductor storage device, following FIG. 8.

Next, as illustrated in FIG. 9, in the cell area (Cell), the stacked body 2, the semiconductor layer 134, the insulating film 2g, the semiconductor layer 133, the intermediate film 13c, the sacrifice film 13b, the intermediate film 13a, and the semiconductor layer 131 are subjected to anisotropic etching, thereby forming the memory hole MH. The memory hole MH is formed from the upper end of the stacked body 2 to the middle of the semiconductor layer 131. The semiconductor layer 134, the insulating film 2g, the semiconductor layer 133, the intermediate film 13c, the sacrifice film 13b, the intermediate film 13a, and the semiconductor layer 131 are subjected to the anisotropic etching via the memory hole MH, and at a portion corresponding to the semiconductor portion 13 (for example, the semiconductor layer 131, the sacrifice film 13b, and the semiconductor layer 133) and a portion corresponding to the semiconductor portion 14 (for example, the semiconductor layer 134), a diameter of the memory hole MH may be expanded.

Figure 10:
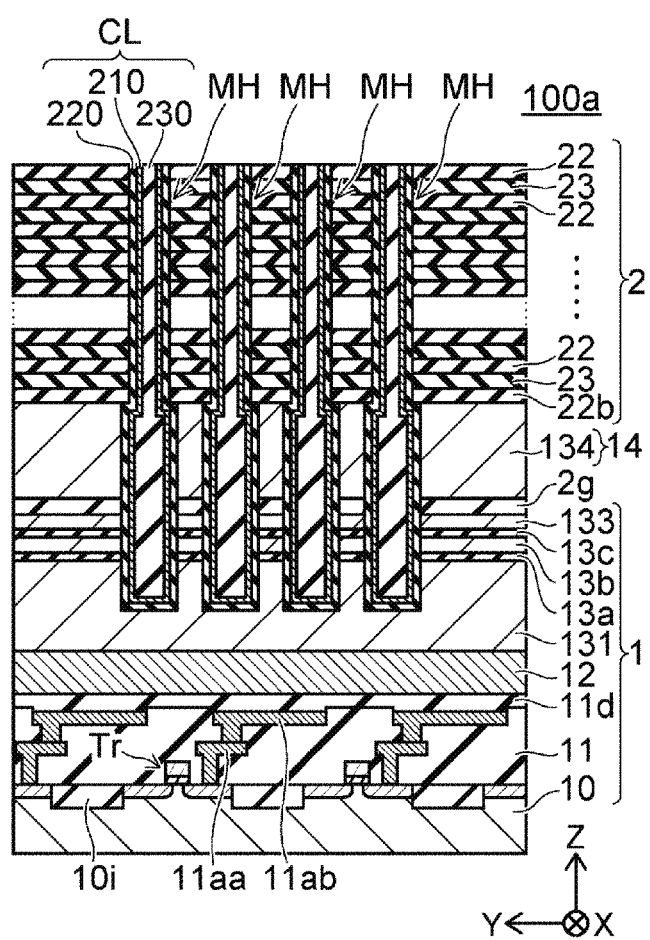
FIG. 10 is a cross-sectional view illustrating an example of the manufacturing method of the semiconductor storage device, following FIG. 9.

Next, as illustrated in FIG. 10, the memory film 220 is formed in the memory hole MH. The memory film 220 contains a silicon nitride and a silicon oxide. Next, the semiconductor body 210 is formed on the memory film 220. The semiconductor body 210 contains, for example, undoped silicon or p-type doped silicon. Next, the core layer 230 is formed on the semiconductor body 210. The core layer 230 contains, for example, a silicon oxide. Accordingly, the memory hole MH is embedded by the semiconductor body 210, the memory film 220, and the core layer 230.

Figure 11:
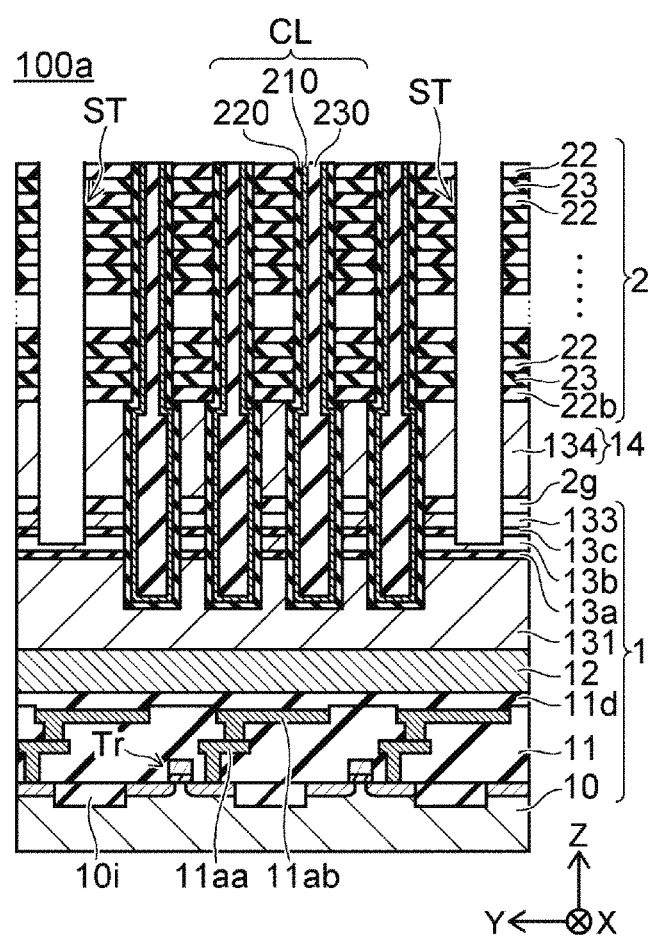
FIG. 11 is a cross-sectional view illustrating an example of the manufacturing method of the semiconductor storage device, following FIG. 10.

Next, as illustrated in FIG. 11, the stacked body 2, the semiconductor layer 134, the insulating film 2g, the semiconductor layer 133, the intermediate film 13c, and the sacrifice film 13b are subjected to the anisotropic etching, thereby forming the deep slit ST. The deep slit ST is formed from the upper end of the stacked body 2 to the middle of the sacrifice film 13b.

Figure 12:
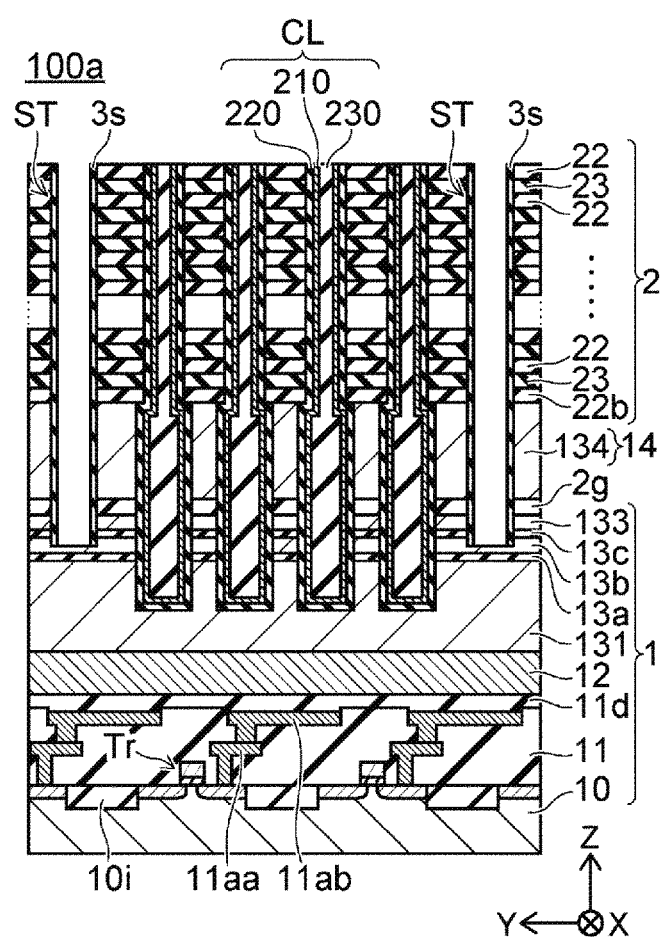
FIG. 12 is a cross-sectional view illustrating an example of the manufacturing method of the semiconductor storage device, following FIG. 11.

Next, as illustrated in FIG. 12, a stopper film 3s is formed on the side wall of the deep slit ST. The stopper film 3s contains, for example, a silicon nitride.

Figure 13:
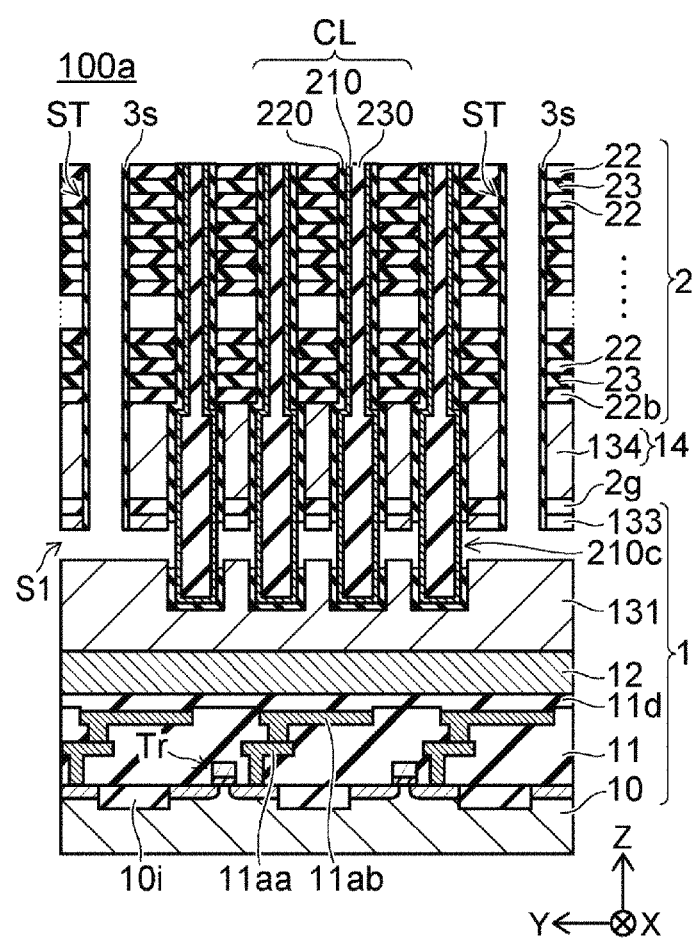
FIG. 13 is a cross-sectional view illustrating an example of the manufacturing method of the semiconductor storage device, following FIG. 12.

Next, as illustrated in FIG. 13, the sacrifice film 13b is subjected to isotropic etching via the deep slit ST, thereby removing the sacrifice film 13b. In this isotropic etching process, for example, in comparison with a silicon oxide and a silicon nitride, an etchant capable of etching n-type doped silicon or undoped silicon far faster is selected. Accordingly, a space S1 is formed between the intermediate film 13a and the intermediate film 13c. The cover insulating film 221 of the memory film 220 (FIGS. 2A and 2B) is subjected to the isotropic etching via the deep slit ST, thereby removing the cover insulating film 221. In this isotropic etching process, for example, in comparison with a silicon nitride, an etchant capable of etching a silicon oxide far faster is selected. Next, the charge trapping film 222 of the memory film 220 (FIGS. 2A and 2B) is subjected to the isotropic etching via the deep slit ST, thereby removing the charge trapping film 222. In this isotropic etching process, for example, in comparison with a silicon oxide, an etchant capable of etching a silicon nitride far faster is selected. Next, the tunnel insulating film 223 of the memory film 220 (FIGS. 2A and 2B) is removed via the deep slit ST. In this process, the intermediate films 13a and 13c are also removed. In this isotropic etching process, for example, in comparison with a silicon nitride, an etchant capable of etching a silicon oxide far faster is selected. Accordingly, the space S1 is expanded between the semiconductor layer 131 and the semiconductor layer 133, and the semiconductor body 210 is exposed to the space S1 in the columnar portion CL. A portion where the semiconductor body 210 is exposed becomes a contact portion 210c.

Figure 14:
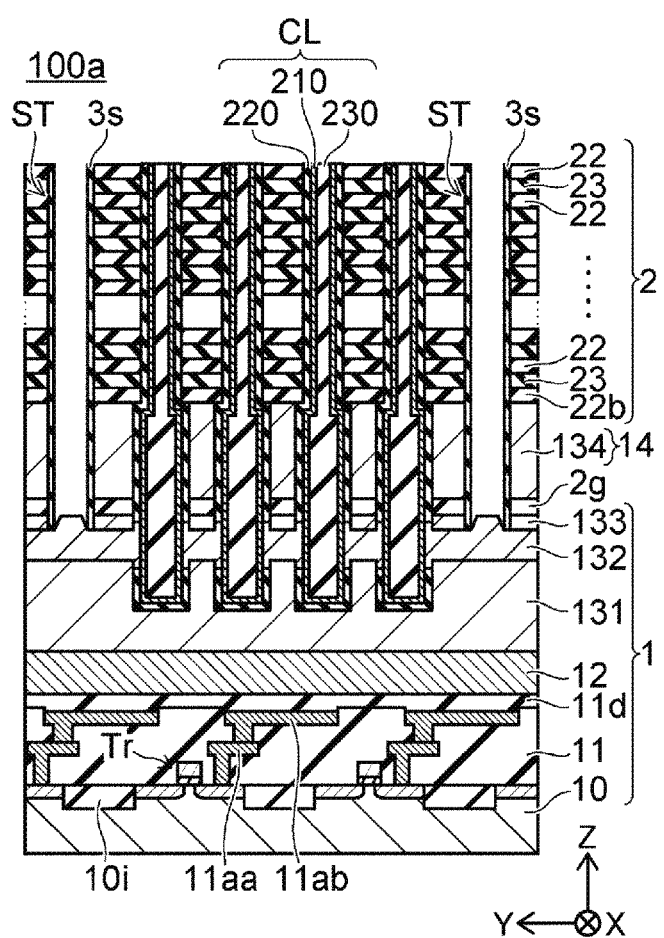
FIG. 14 is a cross-sectional view illustrating an example of the manufacturing method of the semiconductor storage device, following FIG. 13.

Next, as illustrated in FIG. 14, the semiconductor layer 132 is formed by embedding the inside of the space S1 with the semiconductor via the deep slit ST. The semiconductor layer 132 is, for example, n-type doped silicon.

Figure 15:
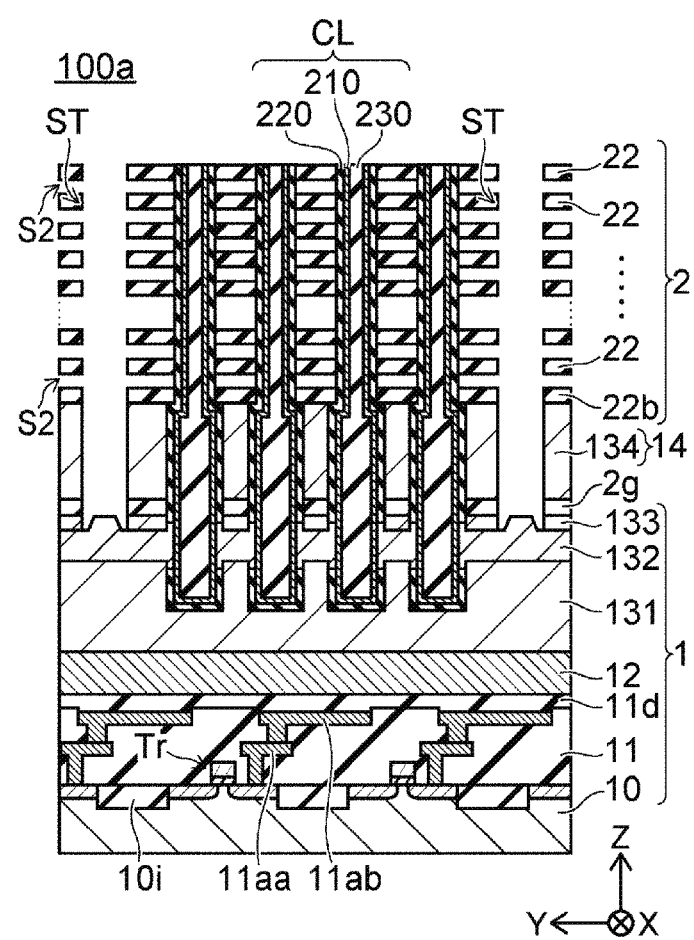
FIG. 15 is a cross-sectional view illustrating an example of the manufacturing method of the semiconductor storage device, following FIG. 14.

Next, as illustrated in FIG. 15, the stopper film 3s and the sacrifice film 23 are subjected to the isotropic etching via the deep slit ST, thereby removing the stopper film 3s and the sacrifice film 23. Accordingly, a space S2 is formed between the insulating layers 22. In this isotropic etching process, for example, in comparison with a silicon oxide and polysilicon, an etchant capable of etching a silicon nitride far faster is selected.

Figure 16:
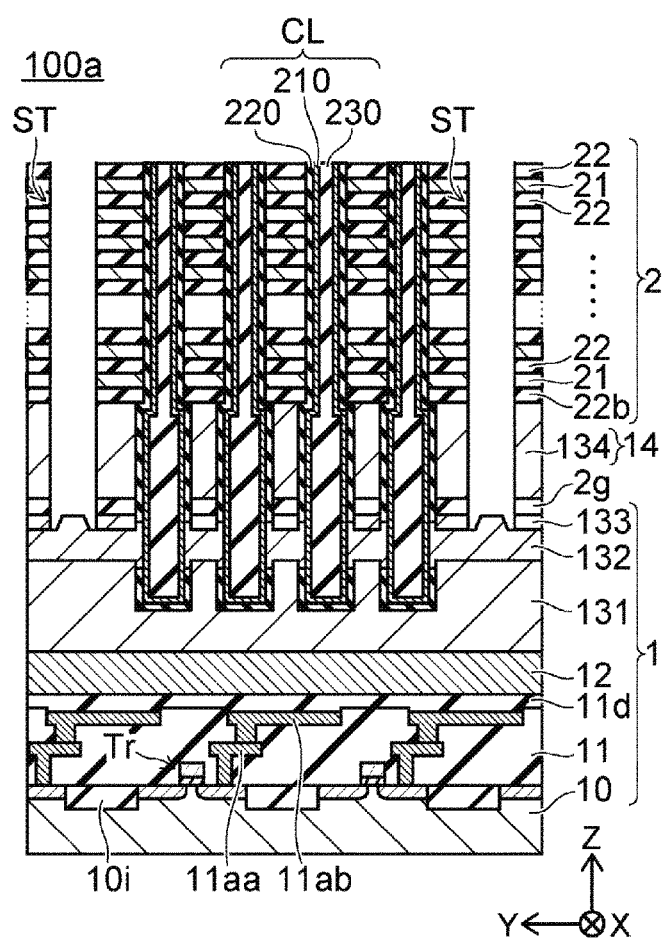
FIG. 16 is a cross-sectional view illustrating an example of the manufacturing method of the semiconductor storage device, following FIG. 15.

Next, as illustrated in FIG. 16, the inside of the space S2 is embedded with a conductive material via the deep slit ST, thereby forming the conductive layer 21. The conductive layer 21 contains, for example, tungsten.

Figure 17:
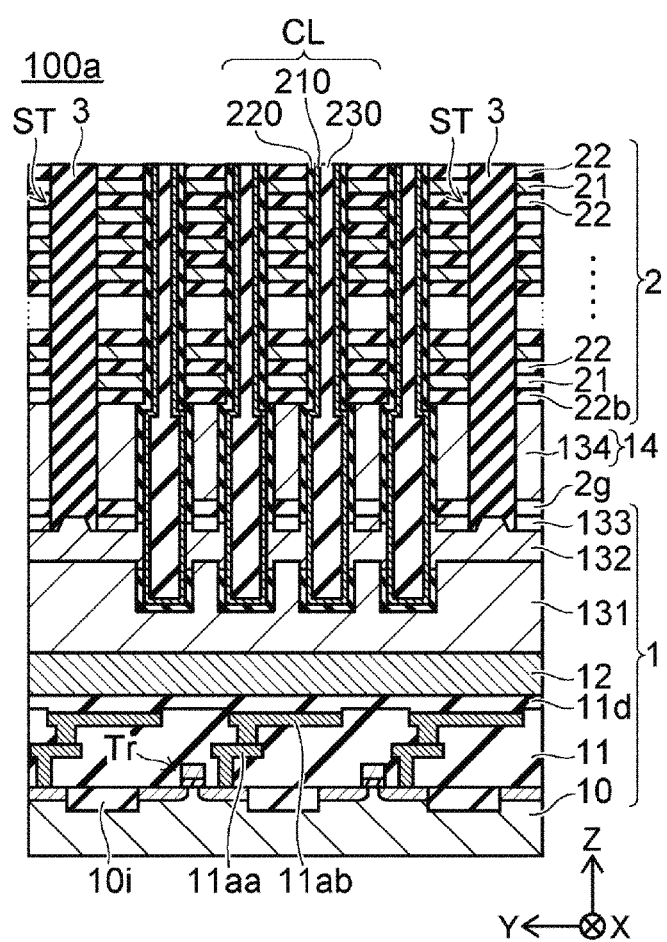
FIG. 17 is a cross-sectional view illustrating an example of the manufacturing method of the semiconductor storage device, following FIG. 16.

Next, as illustrated in FIG. 17, the deep slit ST is embedded with an insulator, thereby forming the plate-shaped portion 3. The plate-shaped portion 3 contains, for example, a silicon oxide.

Figure 18:
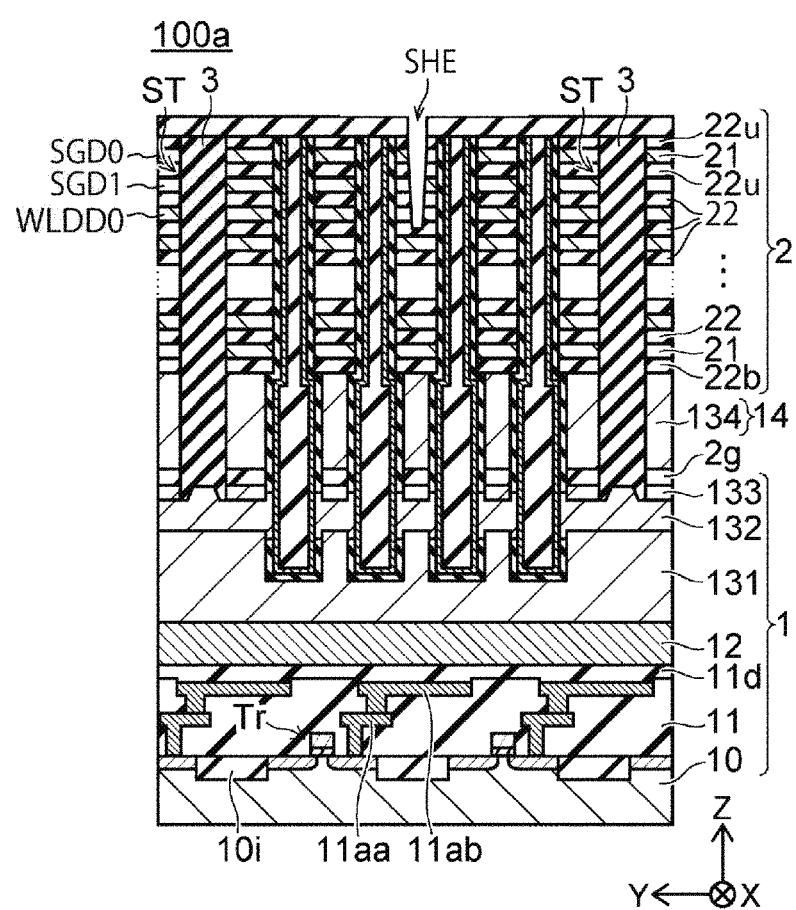
FIG. 18 is a cross-sectional view illustrating an example of the manufacturing method of the semiconductor storage device, following FIG. 17.

Next, as illustrated in FIG. 18, after the insulating film is deposited, the conductive layer 21 corresponding to the upper conductive layers at the upper portion of the stacked body 2 (SGD0, SGD1, and WLDD0 in FIG. 5) and the insulating layer 22 therebetween are subjected to anisotropic etching in the stacking direction (Z direction) of the stacked body 2 by using a lithography technique and a reactive ion etching (RIE) method. Accordingly, for example, the slit SHE penetrates the upper conductive layers SGD0 and SGD1 in FIG. 5. The slit SHE may or may not penetrate the dummy word line WLDD0. At this time, since the conductive layer 21 formed of a metal material such as tungsten as well as the insulating layer 22 is etched, as illustrated in FIG. 18, the slit SHE has a taper so that its width becomes narrower as getting closer to the bottom portion.

Figure 19:
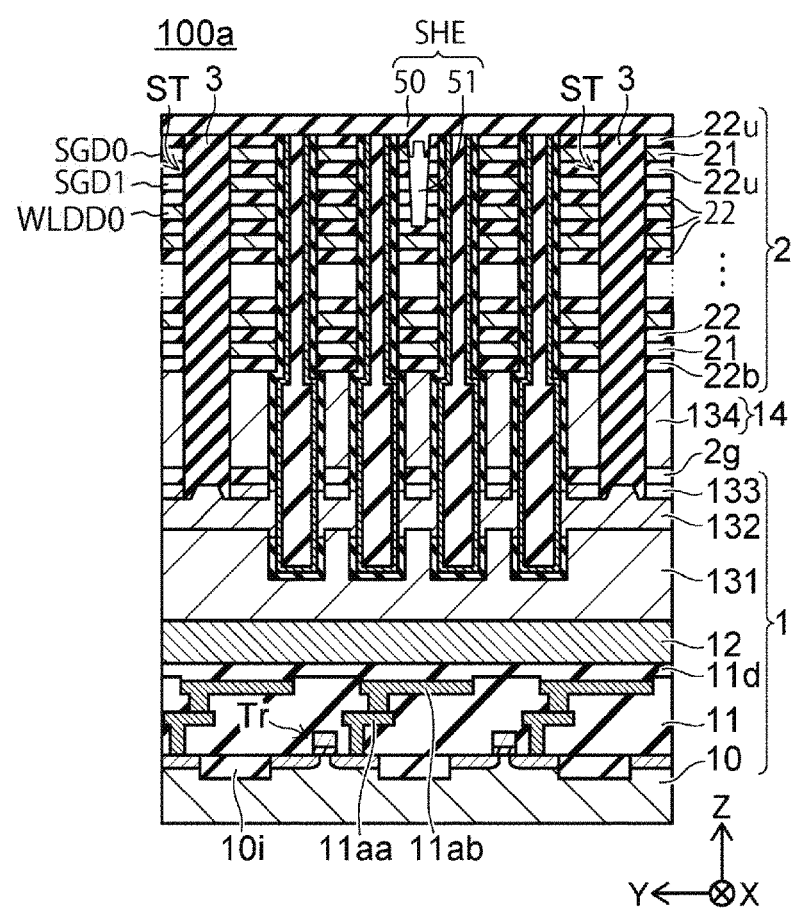
FIG. 19 is a cross-sectional view illustrating an example of the manufacturing method of the semiconductor storage device, following FIG. 18.

Next, as illustrated in FIG. 19, film-forming coverage is controlled by a plasma enhanced-chemical vapor deposition (PE-CVD) method, and an insulator is deposited on the slit SHE. Accordingly, the insulating film 50 formed of the insulator closes only the upper opening of the slit SHE. At this time, the insulator does not enter the bottom portion of the slit SHE, and cannot embed the inside of the slit SHE. Therefore, the cavity 51 remains inside the slit SHE. The insulator forming the insulating film 50 includes, for example, silicon oxide. The insulating film 50 may be provided up to an intermediate portion in the slit SHE. That is, the cavity 51 may remain at least at the bottom portion of the slit SHE. In this manner, the slit SHE is formed. The upper conductive layers of the stacked body 2 (SGD0, SGD1, and WLDD0) are electrically isolated by the slit SHE.

Thereafter, although not illustrated, an interlayer insulating film, a contact plug, and a bit line BL are formed above the stacked body 2 according to a well-known method. Accordingly, the semiconductor storage device 100a illustrated in FIG. 1A is completed.

As described above, according to the embodiment, the insulating film 50 closes the upper opening of the slit SHE, and the cavity (the air gap) 51 is provided in the slit SHE below the insulating film 50. Accordingly, even though the width of the slit SHE is narrow, the drain-side select gates SGD0 and SGD1 can be electrically and sufficiently isolated by the cavity 51 of the slit SHE. That is, the breakdown voltage of the drain-side select gates SGD0 and SGD1 in the slit SHE can be maintained high. Accordingly, the width of the slit SHE can be relatively narrow, and the slit SHE does not need to be formed excessively deep. As a result, the layout area of the memory cell array MCA can be reduced and the number of layers of the dummy word lines can be reduced. What is described above leads to the miniaturization of the memory cell array MCA.

Second Embodiment

Figure 20:
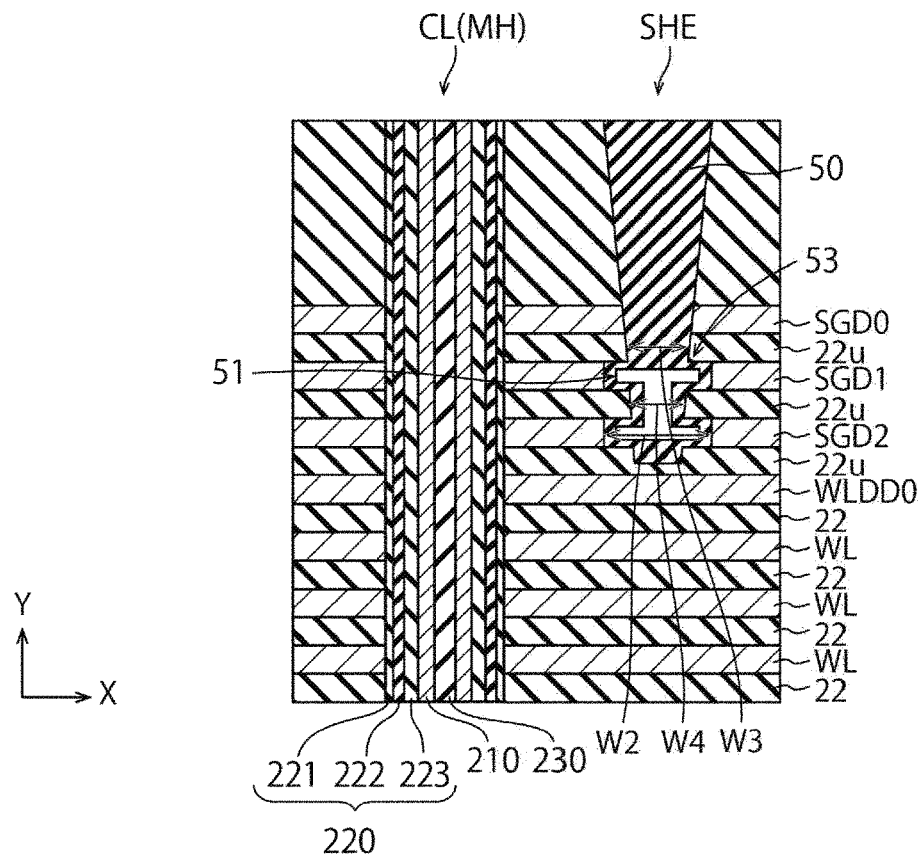
FIG. 20 is a cross-sectional view illustrating an example of a configuration of a semiconductor storage device according to a second embodiment.

FIG. 20 is a cross-sectional view illustrating an example of a configuration of a semiconductor storage device according to a second embodiment. In the same manner as that of FIG. 5, FIG. 20 illustrates a cross section in a perpendicular direction with respect to an extending direction of the slit SHE when viewed from the stacking direction (Z direction) of the stacked body 2. In the second embodiment, in the cross section of FIG. 20, the slit SHE includes an intermediate portion 53 including a width W3 that is narrower than a width W2 of its bottom portion. In other words, the slit SHE is wide at the upper opening, but is constricted at the intermediate portion 53, and further widens at the bottom portion. In the second embodiment, for convenience, the number of layers of the drain-side select gate is three layers (SGD0 to SGD2).

The insulating film 50 embeds the inside of the slit SHE from the upper opening to the constricted intermediate portion 53, and includes the cavity (a void) 51 in the bottom portion below the intermediate portion 53. Accordingly, the cavity 51 is located below the intermediate portion 53 in the slit SHE.

For example, the cavity 51 is provided at a location corresponding to the drain-side select gates SGD1 and SGD2 having a width wider than that of the intermediate portion 53. For example, since a metal material such as tungsten is used for the drain-side select gates SGD1 and SGD2, it is possible to selectively perform etching by wet etching. Therefore, the width of the cavity 51 is wider at the location corresponding to the drain-side select gates SGD1 and SGD2 (the conductive layer 21) than at a location corresponding to the upper insulating layer 22u provided between the drain-side select gates SGD1 and SGD2.

Other configurations of the second embodiment may be the same as the corresponding configurations of the first embodiment. Therefore, the second embodiment can obtain the same effects as that of the first embodiment. In the second embodiment, the cavity 51 is provided at the bottom portion of the slit SHE, and further the width of the slit SHE in the drain-side select gates SGD1 and SGD2 near the bottom portion is widened. Therefore, according to the second embodiment, the drain-side select gates SGD1 and SGD2 can be further electrically isolated by the slit SHE and the cavity 51. That is, even though the slit SHE has the taper shape, the capacitive coupling of the drain-side select gates SGD1 and SGD2 near the bottom portion of the slit SHE is prevented by the slit SHE and the cavity 51.

FIGS. 21 to 24 are cross-sectional views illustrating an example of a manufacturing method of the semiconductor storage device according to the second embodiment. FIGS. 21 to 24 correspond to a cross section where a portion of the slit SHE of FIG. 20 is extracted.

Figure 21:
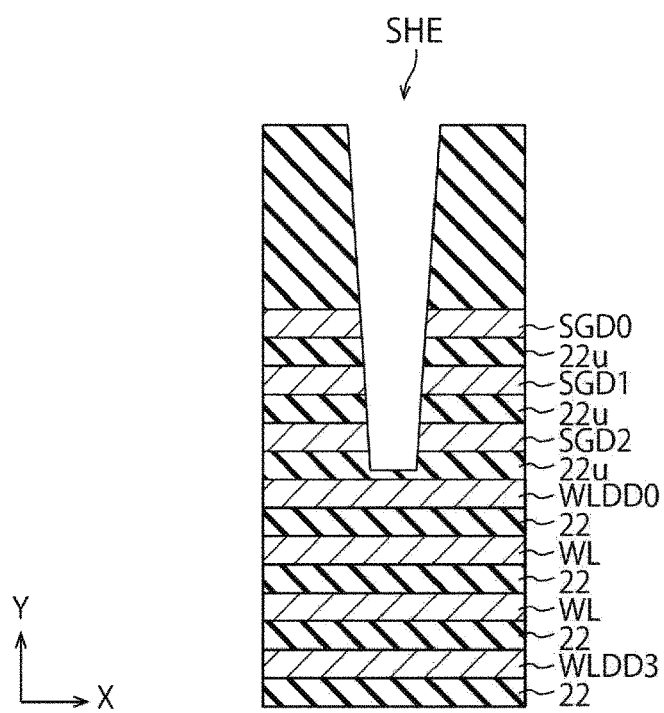
FIG. 21 is a cross-sectional view illustrating an example of a manufacturing method of the semiconductor storage device according to the second embodiment.

After completing the processes illustrated with reference to FIGS. 7 to 18, the slit SHE can be formed as illustrated in FIG. 21.

Figure 22:
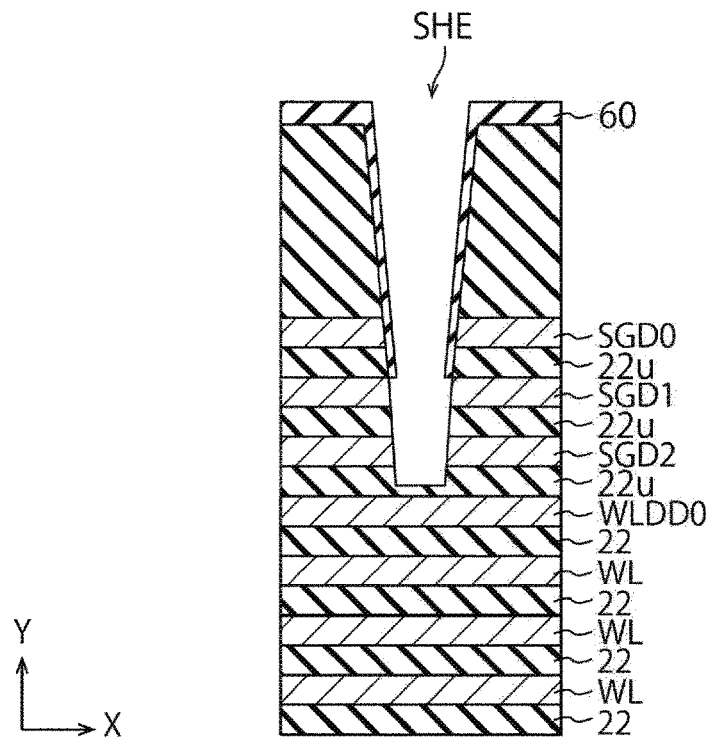
FIG. 22 is a cross-sectional view illustrating an example of the manufacturing method of the semiconductor storage device, following FIG. 21.

Next, as illustrated in FIG. 22, an insulating film 60 as a mask material is deposited on the stacked body 2. At this time, the insulating film 60 is not formed on an inner wall at the bottom portion of the slit SHE by the control of film forming conditions, but covers only an inner wall at the upper portion thereof. Coating properties (coverage) of the insulating film 60 can be controlled by, for example, adjusting a gas ratio and a discharge in a PE-CVD process. For example, in the second embodiment, the drain-side select gate SGD0 exposed to the inner wall of the slit SHE is covered, and the drain-side select gates SGD1 and SGD2 are left exposed. When the slit SHE is formed up to the dummy word line WLDD0, the insulating film 60 also does not cover the dummy word line WLDD0.

Figure 23:
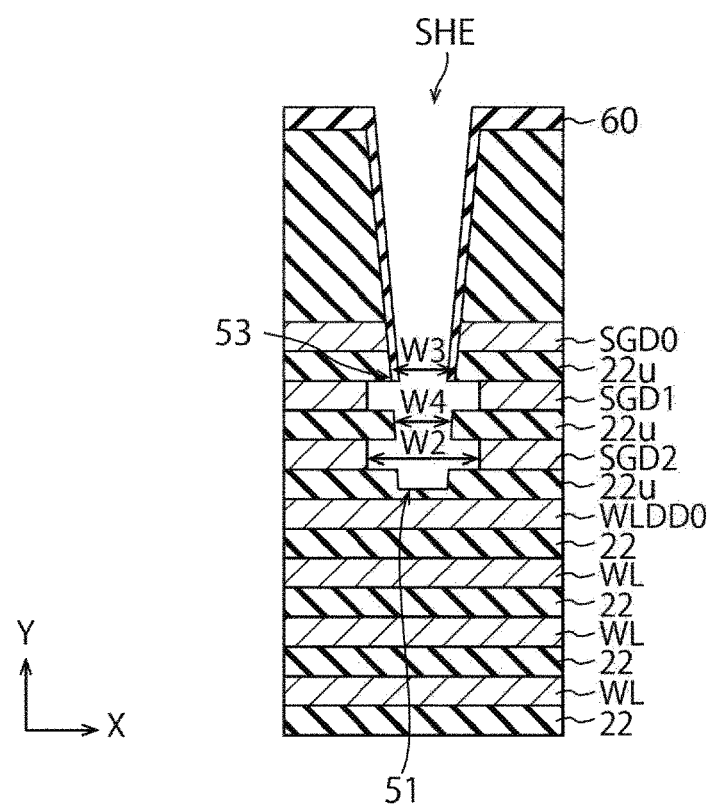
FIG. 23 is a cross-sectional view illustrating an example of the manufacturing method of the semiconductor storage device, following FIG. 22.

Next, as illustrated in FIG. 23, the drain-side select gates SGD1 and SGD2 on the lower inner wall of the slit SHE are subjected to the isotropic etching by using the insulating film 60 as a mask. At this time, when the drain-side select gates SGD1 and SGD2 are tungsten, wet etching may be performed by using hydrogen peroxide. As a result, the drain-side select gates SGD1 and SGD2 are recessed in the Y direction. In the slit SHE, a width (a distance) between the drain-side select gates SGD1 or a width (a distance) W2 between the drain-side select gates SGD2 is wider than a width W3 of the intermediate portion 53. In a cross section of a perpendicular direction with respect to the extending direction of the slit SHE, the width W3 between the inner walls of the intermediate portion 53 of the slit SHE is smaller than the width W2 between the lower inner walls of the slit SHE. That is, the slit SHE has a constricted shape in the intermediate portion 53.

Figure 24:
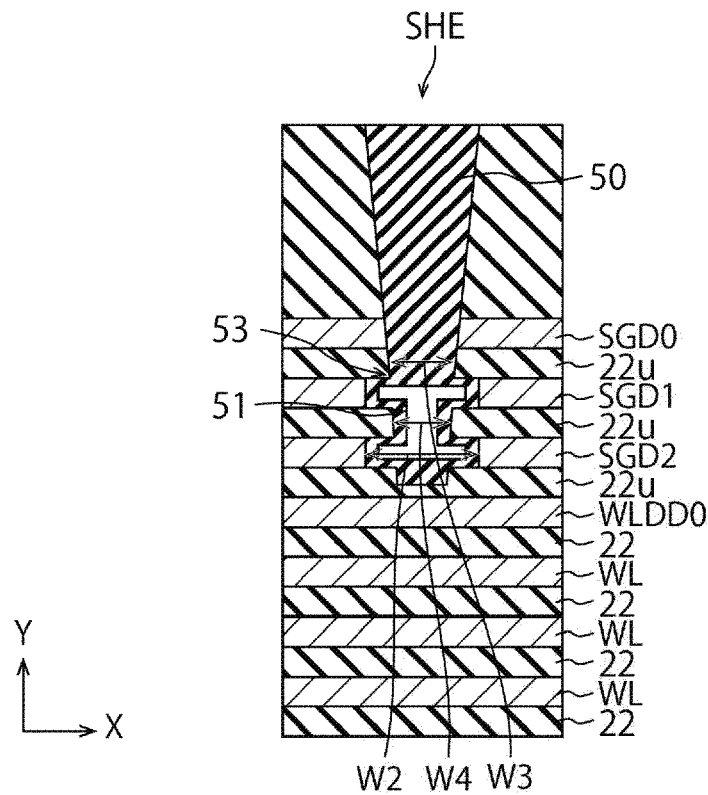
FIG. 24 is a cross-sectional view illustrating an example of the manufacturing method of the semiconductor storage device, following FIG. 23.

Next, by removing the insulating film 60, or on the insulating film 60 the insulating film 50 is deposited as a second insulating layer. The insulating film 50 may be deposited by a PE-CVD method. At this time, as illustrated in FIG. 24, the constricted portion of the intermediate portion 53 is easy to be closed by the material of the insulating film 50. Therefore, the slit SHE above the intermediate portion 53 is filled with the insulating film 50, and the cavity (the void) 51 is easily formed at the bottom portion below the intermediate portion 53. That is, the insulating film 50 closes the upper portion of the slit SHE while leaving the cavity 51 between the lower inner walls of the slit SHE. Therefore, in the slit SHE, the cavity 51 is formed between the drain-side select gates SGD1 and between the drain-side select gates SGD2.

The width W2 in the Y direction of the slit SHE provided in the drain-side select gates SGD1 and SGD2 is wider than the width W4 in the Y direction of the slit SHE in the insulating layer 22u between the drain-side select gate SGD1 and the drain-side select gate SGD2.

Accordingly, the width in the Y direction of the cavity 51 provided in the drain-side select gates SGD1 and SGD2 is wider than the width in the Y direction of the cavity 51 corresponding to the insulating layer 22u between the drain-side select gate SGD1 and the drain-side select gate SGD2. As described above, the cavity 51 in the drain-side select gates SGD1 and SGD2 is selectively widened, whereby the slit SHE and the cavity 51 can electrically isolate not only the drain-side select gate SGD0 but also the drain-side select gates SGD1 and SGD2 near the bottom portion of the slit SHE, thereby making it possible to prevent mutual capacitive coupling.

The depth of the slit SHE, the location of the intermediate portion 53, and the location of the cavity 51 may be freely selected. The location of the intermediate portion 53 and the location of the cavity 51 can be controlled by the formation location of the insulating film 60 to be used as a mask. That is, the intermediate portion 53 is located at the lower end of the insulating film 60. For example, when the insulating film 60 covers the side surface of the drain-side select gate SGD0, the intermediate portion 53 is located between the drain-side select gate SGD0 (or the insulating layer 22u directly under the SGD0) and the drain-side select gate SGD1, and the cavity 51 is formed in the drain-side select gates SGD1 to SGD2.

The insulating film 50 is formed to some extent on the inner wall of the slit SHE around the cavity 51. However, the insulating film 50 may not be provided around the cavity 51. That is, the insulating film 50 below the intermediate portion 53 may not be covered and only the cavity 51 may be provided.

Thereafter, although not illustrated, an interlayer insulating film, a contact plug, and a bit line BL are formed above the stacked body 2 by a well-known method. Accordingly, the semiconductor storage device illustrated in FIG. 20 is completed.

MODIFICATION

Figure 25:
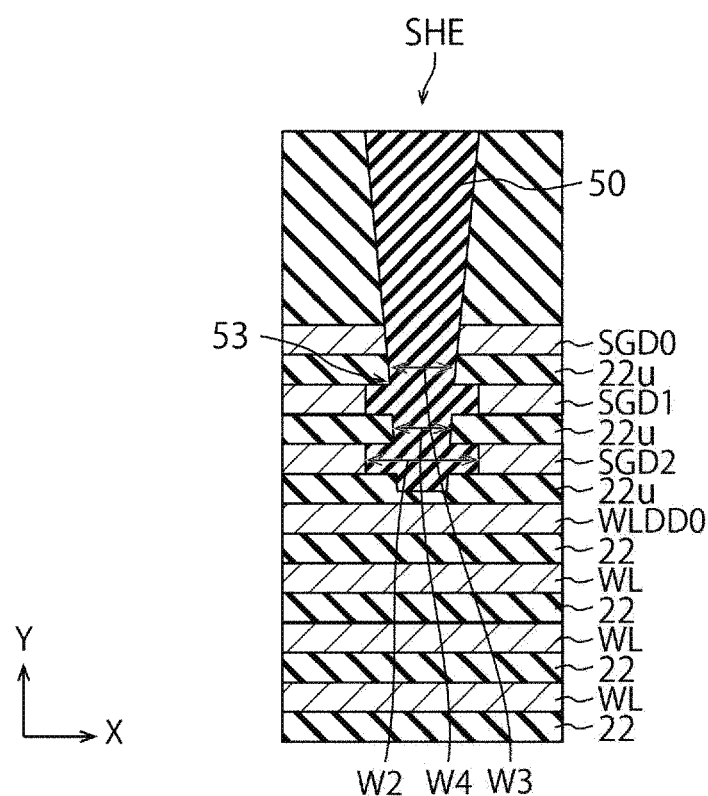
FIG. 25 is a cross-sectional view illustrating an example of a configuration of a semiconductor storage device according to a modification of the second embodiment.

FIG. 25 is a cross-sectional view illustrating an example of a configuration of a semiconductor storage device according to a modification of the second embodiment. In this modification, the cavity 51 is not provided in the slit SHE. The insulating film 50 is filled in the slit SHE. Even in such a modification, the width W2 in the Y direction of the slit SHE provided in the drain-side select gates SGD1 and SGD2 is wider than the width W3 between the inner walls of the intermediate portion 53. The width W2 is wider than the width W4 in the Y direction of the slit SHE in the insulating layer 22u provided between the drain-side select gate SGD1 and the drain-side select gate SGD2. Accordingly, even though the cavity 51 is not provided, the modification can obtain the same effect as that of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a stacked body including a plurality of first insulating layers and a plurality of conductive layers alternately stacked in a first direction, the plurality of conductive layers including at least one first conductive layer functioning as a select gate, a plurality of second conductive layers each functioning as a word line, and at least one third conductive layer provided between the at least one first conductive layer and the plurality of second conductive layers in the first direction and functioning as a dummy word line;
    a plurality of columnar portions that penetrate the stacked body, the plurality of columnar portions each including a first columnar portion and a second columnar portion adjacent to the first columnar portion in a second direction crossing the first direction;
    a first slit extending in the first direction and a third direction crossing the first direction and the second direction, the first slit dividing the at least one first conductive layer and an upper portion of the at least one first columnar portion, the first slit not dividing the plurality of second conductive layers or the at least one second columnar portion; and
    a second insulating layer that overlays an opening of the first slit, which forms a cavity.

2. The semiconductor storage device according to claim 1, wherein
    the cavity is provided at least at a bottom portion of the first slit.

3. The semiconductor storage device according to claim 1, wherein
    a width of a bottom portion of the first slit is narrower than an upper portion of the first slit.

4. The semiconductor storage device according to claim 1, wherein
    the at least one first conductive layer corresponds to a respective one of the plurality of columnar portions.

5. The semiconductor storage device according to claim 1, wherein
    in a cross section perpendicular to the first direction, the first slit includes an intermediate portion having a width narrower than a width of a bottom portion of the first slit.

6. The semiconductor storage device according to claim 5, wherein
    the cavity is located below the intermediate portion in the first slit.

7. The semiconductor storage device according to claim 1, wherein each of the plurality of columnar portions includes a charge trapping portion.

8. The semiconductor storage device according to claim 1, wherein the plurality of columnar portions are arranged relative to each other based on a hexagonal shape.

9. The semiconductor storage device according to claim 8, wherein the first slit extends across some of the plurality of columnar portions that are arranged along the third direction.

10. The semiconductor storage device according to claim 1, further comprising:
    a second slit, provided in the first direction, that penetrates the stacked body.

11. The semiconductor storage device according to claim 10, wherein the second slit is provided in a plate-shaped portion that extends along the third direction.

* * * * *